United States Patent [19]

Beriger

[11] 3,749,983

[45] July 31, 1973

[54] ARRANGEMENT FOR COMPENSATING PARASITIC CAPACITANCES IN SEMICONDUCTOR RECTIFIER ASSEMBLIES

[75] Inventor: Conrad Beriger, Aarau, Switzerland

[73] Assignee: Aktiengesellschaft Brown, Boveri & Cie, Baden, Switzerland

[22] Filed: Mar. 10, 1972

[21] Appl. No.: 234,037

[30] Foreign Application Priority Data

Mar. 11, 1971 Switzerland ........................ 3692/71

[52] U.S. Cl. .... 317/234 R, 317/234 W, 317/234 H, 317/234 N

[51] Int. Cl. ............................................ H01l 5/00

[58] Field of Search ........................ 317/234, 5.4, 11

[56] References Cited

UNITED STATES PATENTS

| | | | |
|---|---|---|---|
| 3,465,212 | 9/1969 | Grimes et al. | 317/234 |
| 3,444,452 | 5/1969 | Janssen | 321/11 |
| 3,454,841 | 7/1969 | Urba et al. | 317/234 |

*Primary Examiner*—John W. Huckert
*Assistant Examiner*—E. Wojciechowicz
*Attorney*—Pierce, Scheffler & Parker

[57] ABSTRACT

A rectifier assembly is comprised of a large number of semiconductor elements of the thyristor type which are all connected together to form a single series circuit. The semiconductor elements are sub-divided into stages which are arranged in superposed relation to form a rectifier stack, each stage is comprised of two or more series connected units and each such unit is composed of a number of semiconductor elements arranged in a row. In order to compensate for parasitic capacitances which exist in the rectifier assembly, a metal screen is connected to each second junction between the rectifier units and each screen surrounds the rectifier units which are interconnected by this junction towards the outside of the rectifier stack. In addition to the metal screens, which are electrically insulated each from the other, two mutually insulated screening plates are located opposite the metal screens at the outside of the rectifier stack, one of these screening plates carrying the cathode potential of the entire rectifier stack and the other screening plate carrying the anode potential of the stack. The distance between the screening plates and the metal screens increases as the potential difference increases.

5 Claims, 4 Drawing Figures

Figure 1:
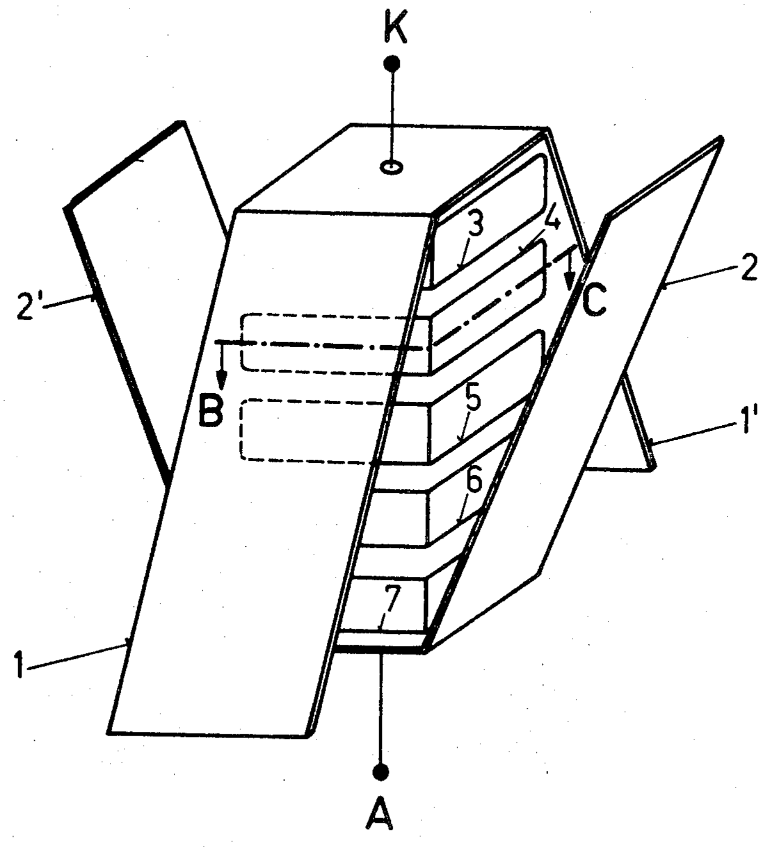

ARRANGEMENT FOR COMPENSATING PARASITIC CAPACITANCES IN SEMICONDUCTOR RECTIFIER ASSEMBLIES

The present invention relates to an apparatus for compensating parasitic capacitances in semiconductor rectifier assemblies which are composed of a large number of semiconductor elements, of which in each case several are assembled in a row one behind the other to form a unit, and the units arranged in stages one above the other, each stage comprising at least two units and all the units being connected together in a turn-like fashion so that all the semiconductor elements are connected in a single series circuit.

Semiconductor rectifiers, in particular thyristor rectifiers, for high-voltage d.c. operation, are currently made up of a large number of series-connected semiconductor devices.

In order with the rectifier when connected in the reverse direction, i.e. when in the blocking mode, to achieve the most uniform possible distribution of the applied high voltage (surge voltage) over all the semiconductor devices and therefore to compensate for the unwanted influence of the component capacitances vis-a-vis earth, in the prior art arrangements, a compensating system made up of lumped capacitors has been provided.

Such introduction of lumped capacitors is described, for example, in Swiss Patent Specification No. 469,396.

However, the introduction of lumped capacitors has considerable drawbacks because, on the one hand, tubular capacitors have too low a resonance frequency (above their resonance frequency they are virtually completely ineffective), whilst on the other hand ceramic capacitors have a very large volume. Capacitors using barium titanate as the dielectric have the particular drawback that their capacitances are closely dependent upon temperature and voltage.

If a steep voltage surge is applied to a semiconductor rectifer in the reverse sense, then for the foregoing reasons symmetrical voltage distribution amongst the individual semiconductor devices is not possible or at any rate can only be achieved at the expense of very heavy outlay.

The object of the invention is to avoid the indicated drawbacks of the prior art.

In accordance with the invention, this object is achieved in that to each second junction between the rectifier units, there is electrically connected a metal screen which surrounds the units interconnected by this junction, so as to be aligned towards the outside of the semiconductor rectifier, the individual metal screens being electrically insulated from one another, and that furthermore one screening plate carrying the cathode potential of the entire rectifier stack and another such plate carrying the anode potential, are provided, these screening plates being located opposite the aforesaid metal screen at the outside of the semiconductor rectifier, the interval between said screening plates and the metal screens increasing as the potential difference increases and the screening plates being electrically insulated from one another.

The particular advantage of the invention resides in the fact that the semiconductor rectifier is substantially more reliable because the aforestated drawbacks of the lumped capacitors as well as their general susceptibility to breakdown, are excluded.

Because there is no upper cut-off frequency to take into consideration, a series choke can be dispensed with, this being an element which does have to be provided in one prior art arrangement in order to limit the voltage rise rate (*du/dt*) (so that the cut-off frequency of the tubular capacitors is not exceeded).

In the drawings,an example of the subject of the invention has been illustrated.

Figure 3:
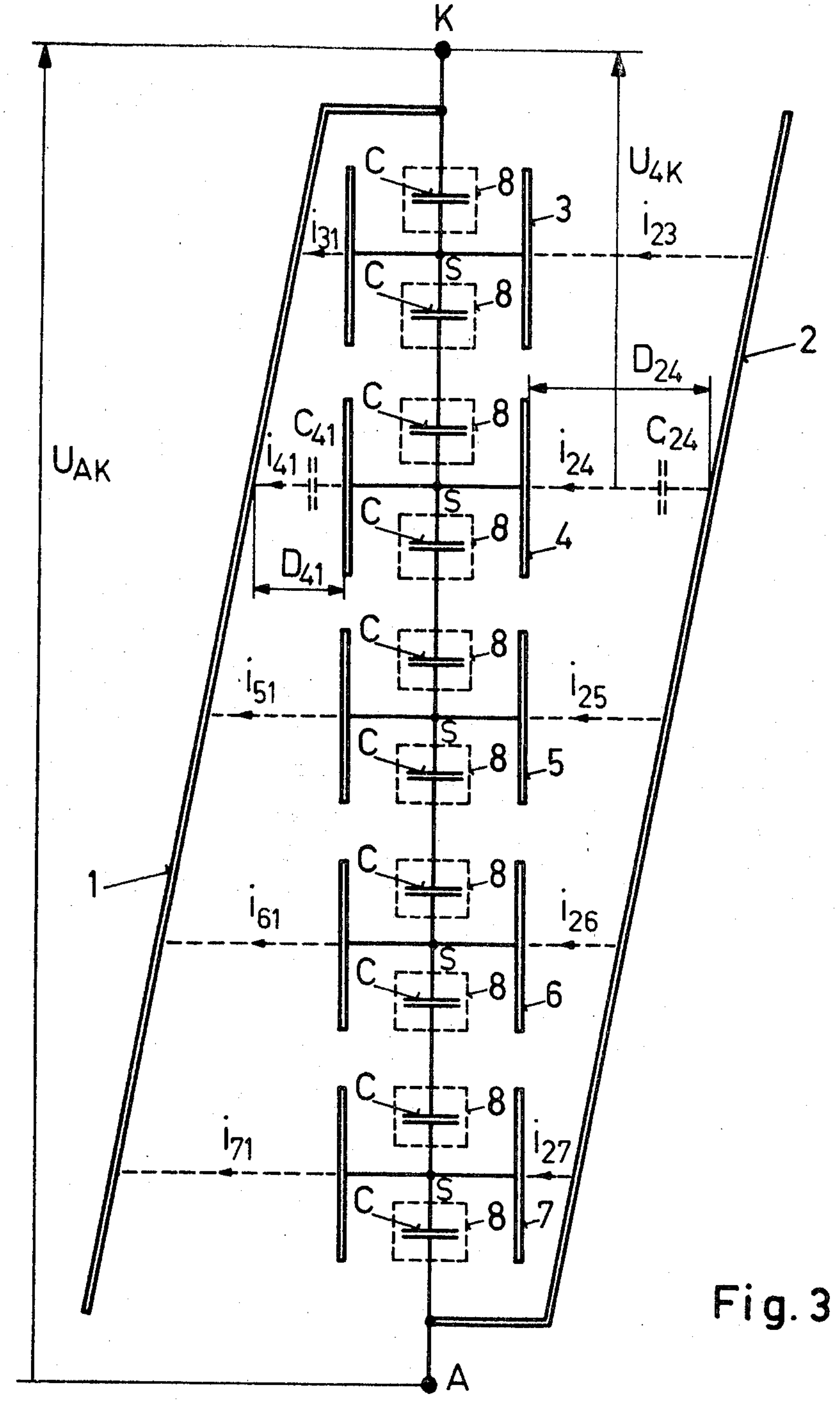

FIG. 1 illustrates a simplified, perspective view of a semiconductor rectifier;

FIG. *2a* is a cross-section taken in the plane $\overline{BC}$ of FIG. 1;

FIG. *2b* is a futher possible cross-section, taken in the plane $\overline{BC}$ of FIG. 1;

FIG. 3 is an electrical equivalent circuit diagram of a semiconductor rectifier when in the blocking mode.

In FIG. 1, the references 1, 1' indicate a cathode side screening plate and 2, 2' an anode side screening plate, whilst A and K indicate anode and cathode connections respectively.

The references 3, 4, 5, 6 and 7 indicate metal screens. The letters B and C define a plane of section and a sectional view taken in the direction of the arrow, has been represented in FIGS. *2a* and *2b*.

In all the figures, similar parts are marked by similar references.

In FIG. *2a*, 4' is a metal screen which is arranged in the same stage as the one marked 4.

The references 8, in FIGS. *2a*, *2b* and 3, illustrate units which consist, for example, in each case of the series connection of 10 semiconductor devices.

*k* indicates a connection to the next stage up and *a* is a connection to the next stage down, whilst S indicates connection points for the metal screens 3, 3', 4, 4' etc. $D_{41}$ and $D_{24}$ indicate the distances between the metal screen 4 and the screen plates 1 and 2. Moreover, in FIG. 3 the resultant barrier layer capacitances in each case of a unit 8 have been indicated by the reference C, whilst $i_{23}$ to $i_{27}$ and $i_{31}$ to $i_{71}$ indicate currents and $U_{AK}$ and $U_{4K}$ voltages. $C_{41}$ and $C_{24}$ indicate the capacitances at work between the metal screen 4 and the screening plates 1 and 2.

The equivalent circuit diagram of FIG. 3 is based upon an arrangement in five stages (corresponding to FIG. 1), each stage containing two units 8 of the kind shown in FIG. *2b*.

Each unit is a compact arrangement comprising for example, a row of ten semiconductor devices (thyristors together with cooling elements possibly designed for oil cooling).

In the reverse or blocking mode, it is simply the barrier layer capacitance of each individual semiconductor device which is evident, and to simplify matters the resultant capacitance C corresponding to the series-connection of all the semiconductor devices of a unit, will be considered.

Self-evidently, in looking at FIG. 3, it has to be borne in mind that the three-dimensional arrangement (FIG. 1) can only be illustrated in a two-dimensional way. However, from this the general principle of compensation and also the fundamental principle of the invention, can be understood.

We will now assume that a direct voltage of 200 kV is applied across the semiconductor rectifier in the reverse sense. In the static state, (direct voltage) this high voltage is uniformly distributed over all the semiconductor devices, each one being operated at a point below its critical breakdown voltage.

However, the situation is entirely different if a surge voltage, likewise of 200 kV for example, is also applied to the semiconductor rectifier (a surge voltage of as much as two times the rated voltage is possible).

Under this dynamic load, with which the voltage alters at a specific rate (*du/dt*), a current now flows from the anode A through the series-arrangement of all the barrier layer capacitances C, to the cathode K. Also, however, capacitive displacement currents $i_{23}$ to $i_{71}$ flow from the anode A across the screening plate 2, the individual metal screens 3 to 7 and the screening plate 1, to the cathode K.

Because of the design of the metal screens of the screening plates, as shown in the figures, and in accordance with the invention, the result is achieved that the current $i_{27}$ (spoken as two to seven) is the same as the current $i_{71}$. There is a similar identity between the currents $i_{26}/i_{61}$, $i_{25}/i_{51}$, $i_{24}/i_{41}$ and $i_{23}/i_{31}$.

As can be seen, therefore, these capacitive displacement currents do not affect the current flowing through the barrier layer capacitances C, in any way. Accordingly, this current has the same magnitude as each capacitance C, so that consequently the surge voltage is also completely uniformly distributed over all the units 8 and semiconductor devices. Since each semiconductor rectifier is designed for an overload cut-out level of e.g. ± 2, 4 × $U_{Nenn}$ (see Brown Boveri Mitteilungen, volume 55, for this recommendation), there is no risk of damage.

However, it may seem questionable to arrange these screening plates 1 and 2 so close that they produce these capacitive displacement currents at all. As far as this goes, it is worth mentioning that in practice it is virtually out of the question to avoid the occurrence of parasitic displacement currents because there are always parasitic capacitances between the individual units and earth or a housing wall or a neighbouring set of machinery etc. This would mean, in effect, that the magnitude for example of the currents $i_{23}$, $i_{24}$, $i_{25}$, $i_{26}$ and $i_{27}$, would be arbitrarily dependent upon the environmental conditions. Then, however, it would be impossible to avoid the uncompensated current components flowing across the barrier layer capacitances C, with the consequence of differing voltage drops across the individual semiconductor devices. This means that the surge voltage of for example 200 kV will be distributed in a completely irregular manner so that the semiconductor devices of one or even more units 8 will receive more than the permissible reverse voltage and be damaged.

Using the proposed arrangement, on the other hand, the influence of parasitic capacitances can be screened off and the magnitude of the capacitive displacement currents can be predetermined very effectively.

Considering FIG. 3, it will be seen that the metal screens 7, 6, 5, 4 and 3 are increasingly at higher potentials than the anode A and therefore the screening plate 2. The conditions are similar as far as the cathode is concerned.

Taking the example of the stage with the metal screen 4, we will now discuss the determination of the intervals between this screen and the screening plates 1 and 2.

The metal screen 4 in association with the screening plates 1 and 2, forms the capacitances $C_{41}$ and $C_{24}$ these roughly speaking being inversely proportional to the distances $D_{41}$ and $D_{24}$ (assuming that the mutually opposite areas of metal screen and screening plate, remain the same from one stage to the next).

We therefore have:

$$C_{24} \approx 1/D_{24}$$
$$C_{41} \approx 1/D_{41}$$

The capacitive displacement currents can be calculated as follows:

$$i_{41} = dU_{4K}/dt \cdot C_{41} = dU_{4K}/dt \cdot 1/D_{41}$$
$$i_{24} = [d(U_{AK} - U_{4K})]/dt \cdot C_{24} = [d(U_{AK} - U_{4K})]/dt \cdot 1/D_{24}$$

$i_{24}$ must be equal to $i_{41}$, so that:

$dU_{4K}/dt \cdot 1/D_{41} = [d(U_{AK} - {}_{U4K})]/dt \cdot i/d_{24}$ rearranging this we then obtain :

$$dU_{4K}/dt \cdot D_{24} = [d(U_{AK} - U_{4K})]/dt \cdot D_{41}$$

However, because the voltage distribution is to be achieved both under conditions of dynamic loading and in the static condition (no *du/dt*), the simplified form:

$$U_{4K} \cdot {}^{D}{}_{24} = (U_{AK} - U_{4K}) \cdot D_{41}$$

will suffice. If this condition is complied with, then the capacitive displacement currents will be compensated.

In departure from the semiconductor rectifier shown in FIG.1, the screening plates could for example have trapezoidal or triangular surfaces.

Then, of course, to be accurate it must be borne in mind that the capacitance (e.g. $C_{24}$) between metal screen and screening plate, also depends upon the size of the mutually opposite areas. Just as with other complicated shapes, it is then necessary to accurately calculate the capacitance at work between metal screen and screening plates or to measure it. The principle of compensation, however, remains unaffected by this.

Figure 2A:
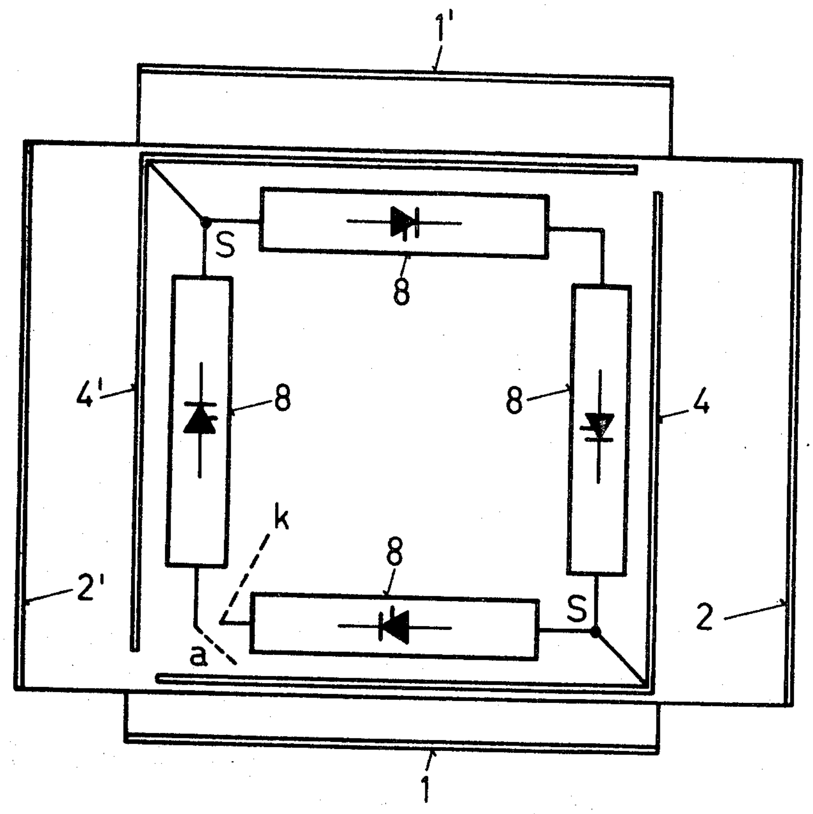
Figure 2B:
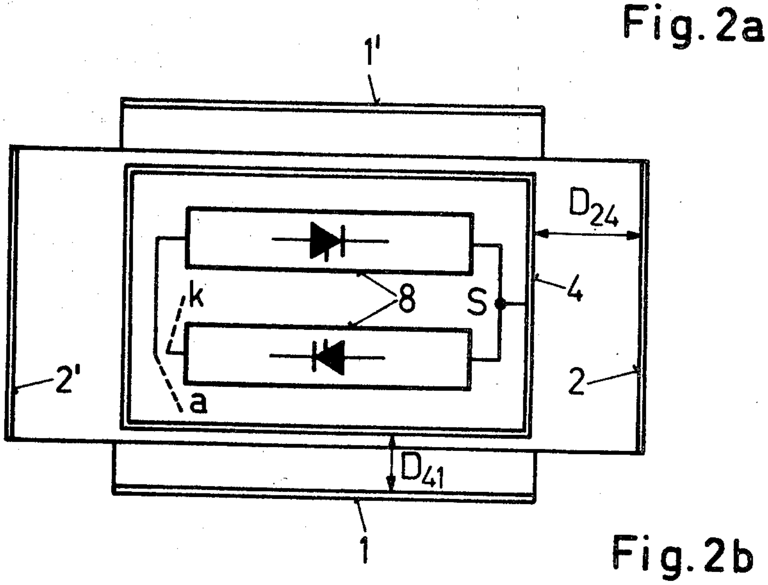

FIG. 2*a* illustrates an arrangement of units which is more frequently encountered than that of FIG. 2*b*. As can be seen, there are four units 8 in each stage so that the total height is less. The inside space can for example, contain the pulse transformer for controlling the individual semiconductor devices. Because there are twice as many units, two metal screens 4 and 4' are also required in each stage. It should be borne in mind in this context that unlike the case of FIG. 2*b*, only part of the screening plates, namely 1 and 2, is in each case located opposite the metal screen 4, whilst the second parts 1' and 2' in each case cooperate with the metal screen 4'.

Although a rectangular configuration has been adopted in the figures, it is not out of the question that metal screens and screening plates of at least partially rounded form, could be used.

In accordance with an advantageous embodiment of the invention, at least one of the screening plates 1, 2 forms part of a vessel surrounding the semiconductor rectifier, for example, an oil vessel for oil-insulated and cooled rectifiers.

I claim:

1. In a rectifier apparatus constituted by rectifier elements of the semiconductor type, wherein a number of said rectifier elements are connected in series to form a rectifier unit, and wherein a number of said rectifier units are arranged in stages one above the other to form a rectifier stack, each said stage comprising at least two of said rectifier units and all of said rectifier units being connected in series, the improvement wherein to compensate for parasitic capacitances each of said stages is substantially surrounded at its outer periphery by a screening device composed of at least one metallic screen being electrically connected to a junction between two of said rectifier units included in the corresponding stage, and a pair of mutually electrically insulated screening plates located at the outside of and opposite to said screening devices and extending along said rectifier stack, said screening plates carrying respectively the cathode and anode potentials of the entire rectifier stack, and the distance between said metallic screens and said screening plates increasing with the increase in potential along the stack.

2. Rectifier apparatus as defined in claim 1 wherein all of said rectifier units are arranged to form a helical-like structure with said stages forming the turns of said helical structure, and one of said metallic screens each being electrically connected to the junction between two subsequent rectifier units included in one of said stages, and within the series arrangement of rectifier units each second junction between subsequent rectifier units being electrically connected to a corresponding metallic screen, while each junction following a junction which is connected to a corresponding metallic screen is free of an immediate connection to any of said metallic screens.

3. Rectifier apparatus as defined in claim 1 wherein the respective distances between the metallic screens and said screening plates are selected such that the capacitive displacement current flowing between one screening plate and a particular metallic screen is substantially equal to the capacitive displacement current flowing between the other screening plate and that same metallic screen.

4. Rectifier apparatus as defined in claim 3 wherein each of said screening plates is formed U-shaped and comprises two plate-like legs extending along opposite sides of said rectifier stack, both said U-shaped screening plates being arranged rectangularly with respect to each other in a cross-sectional plane of the rectifier stack.

5. Rectifier apparatus as defined in claim 1 wherein at least one of said screening plates forms a component part of a vessel surrounding the rectifier stack.

* * * * *